(12) United States Patent
Hars

(10) Patent No.: US 7,356,552 B2
(45) Date of Patent: Apr. 8, 2008

(54) VLSI IMPLEMENTATION OF A RANDOM NUMBER GENERATOR USING A PLURALITY OF SIMPLE FLIP-FLOPS

(75) Inventor: Laszlo Hars, Cranberry Township, PA (US)

(73) Assignee: NXP B.V., Eindhoven (NL)

( * ) Notice: Subject to any disclaimer, the term of this patent is extended or adjusted under 35 U.S.C. 154(b) by 717 days.

(21) Appl. No.: 10/801,809

(22) Filed: Mar. 15, 2004

(65) Prior Publication Data

US 2004/0267845 A1 Dec. 30, 2004

Related U.S. Application Data

(60) Provisional application No. 60/454,838, filed on Mar. 14, 2003.

(51) Int. Cl.
*G06F 1/02* (2006.01)

(52) U.S. Cl. ...................... 708/250; 708/255
(58) Field of Classification Search .............. 708/250
See application file for complete search history.

(56) References Cited

U.S. PATENT DOCUMENTS 4,905,176 A * 2/1990 Schulz ...................... 708/252
5,570,307 A * 10/1996 Takahashi .................. 708/256
2003/0061250 A1 * 3/2003 Fujita et al. ............... 708/250

* cited by examiner

*Primary Examiner*—Meng-Al T. An
*Assistant Examiner*—Michael Yaary
(74) *Attorney, Agent, or Firm*—Peter Zawilski

(57) ABSTRACT

A random number generator includes a plurality of groups of independent flip flops, each of the groups having different configurations. Each of the outputs of the plurality of groups of flip flops being connected in an exclusive-or (XOR) arrangement, with a latch connected to the output of the DXOR. A metastable output of at least one of the flip flops causes a random signal to be output by the XOR for random number generation. The groups of flip flops can be divided into equally-sized groups, or unequally-sized groups with different configurations, such as the cross-connecting of NAND gates with or without buffers inserted between the data and clock signals, or inserting buffers between a data line of at least one NAND gate of each of the pairs of NAND gates being connected, or inserting a buffer between clock input of at least one NAND gate of each of the pairs of NAND gates being connected via a buffer. Capacitive loading and cross-connected buffers may also be used to induce varying delays.

20 Claims, 4 Drawing Sheets

VLSI IMPLEMENTATION OF A RANDOM NUMBER GENERATOR USING A PLURALITY OF SIMPLE FLIP-FLOPS

This application claims priority to Provisional Ser. No. 60/454,838 filed Mar. 14, 2003.

FIELD OF THE INVENTION

The invention relates to the phenomenon of metastability and the effect of metastability on semiconductors. More particularly, the present invention relates to the use of metastability in the field of random number generators by creating a random number generator that makes use of the phenomenon via a plurality of flip-flops.

BACKGROUND ART

Latches and flip-flops are widely used in all types of electronic devices for counting, sampling, and storage of data. There are a number of different types of flip-flops named after their primary function, such as D-type flip-flops (data), J-K flip-flops (J and K inputs), and R-S flip-flops (having R and S latches, standard for "reset" and "set") D flip-flops are clocked flip-flops having one clock pulse delay for its output.

Conventional flip-flops, such as D-type, can be used to detect the logic state of an asynchronous digital signal with timing relative to the clock signal that is non-periodic.

However, the operating conditions of the flip-flops can be violated because hold times and setup times are not always consistent with the specifications (such as provided in the data sheets) of the flip-flops used. The violation of the operating conditions of the flip-flops can cause them to go into an unstable (metastable) state that can affect the entire operation of the linked systems. Metastability can occur when both inputs to a latch are set at a logic high (11) and are subsequently set at a logic low (00). Metastability can cause the latch outputs to oscillate unpredictably in a statistically known manner. Such metastable values are then detected by other circuitry as different logic states.

It has been found that intentionally inducing metastability provides the ability to harness the unpredictability of metastable flip-flops outputs as a random number generator.

For example, as shown in FIG. 1, a latch is realized with cross connected NAND gates 115,120. The flip-flop 110 drives this latch, It receives its clock input from clock oscillator 105 through the clock input 106 of flip-flop 110, and the inverting output −Q is connected to the D input, which shapes the clock signal to square-wave. The Q output 107 is connected to both of the NAND gates 115, 120 via delay devices, 112, 114, respectively. If the two NAND gates 115, 120 were truly identical, there would be no need for the delay devices to achieve the highest probability to get the flip-flop formed by the NAND gates 115, 120 to become metastable. However, the NAND gates will ordinarily differ somewhat, and their speed difference will influence the number of times metastability occurs in a time interval.

In VLS integrated circuits there have been attempts at tunable delay by using single tapped-buffer chains, but their implementation has not been practical. The delay resolution has been too course for the dynamic fine tuning required to achieve the highest frequencies at which metastability occurs. Delays were also designed by the introduction of long wires of various lengths, which increased design expense and has been found to be difficult to control using automatic layout tools and standard element libraries.

Current designs of physical (true) random number generators based on flip-flop metastability use single tapped-buffer-chain fixed delay values between their inputs to violate setup and hold timings, in order to provoke metastability. Eventually, the metastable state resolves to some logic level, which is effectively random, depending on the internal noise of the flip-flops. However, the fixed delay values used by the prior art can cause the random number generator to be susceptible to environmental changes. In addition, fixed delay values at large manufacturing variations can make the circuit not work at all or not work at optimal speed.

SUMMARY OF THE INVENTION

The present invention provides a random number generator, and a method of random number generation by exclusive-or-ing (XOR-ing) the output of a large number of individual flip-flops. The variation of the physical layout of the flip-flops ensures the necessary variance of the delays. The present invention eliminates the requirement of explicitly designing the circuit for different delay values, as shown, for example, by the introduction of delay units 112 and 114 in FIG. 1.

DETAILED EMBODIMENTS

It is understood by persons of ordinary skill in the art that the types of gates shown herein below were selected for explanatory purposes, and there can be different arrangements of different type of gates (NAND, NOR, XOR, etc.) in terms of size, function and connectivity that fall within the spirit of the invention and the scope of the appended claims.

Figure 1:
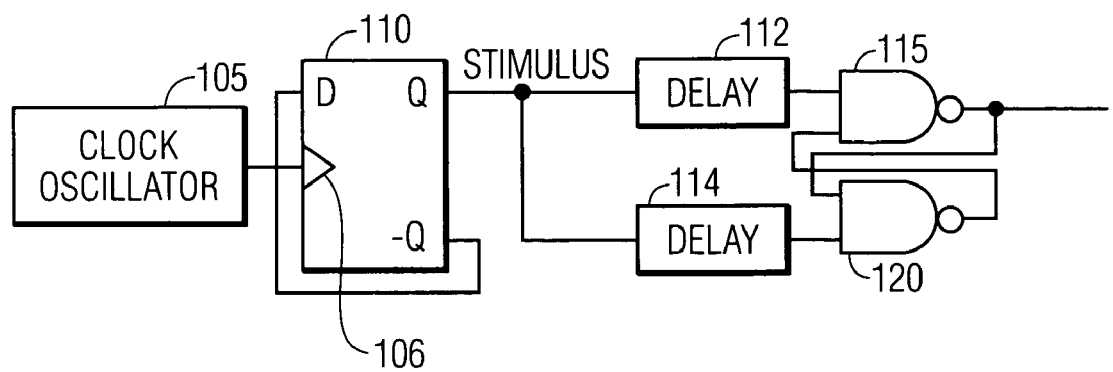
FIG. 1 illustrates a prior art random number generator using a flip-flop and fixed delays.
Figure 2:
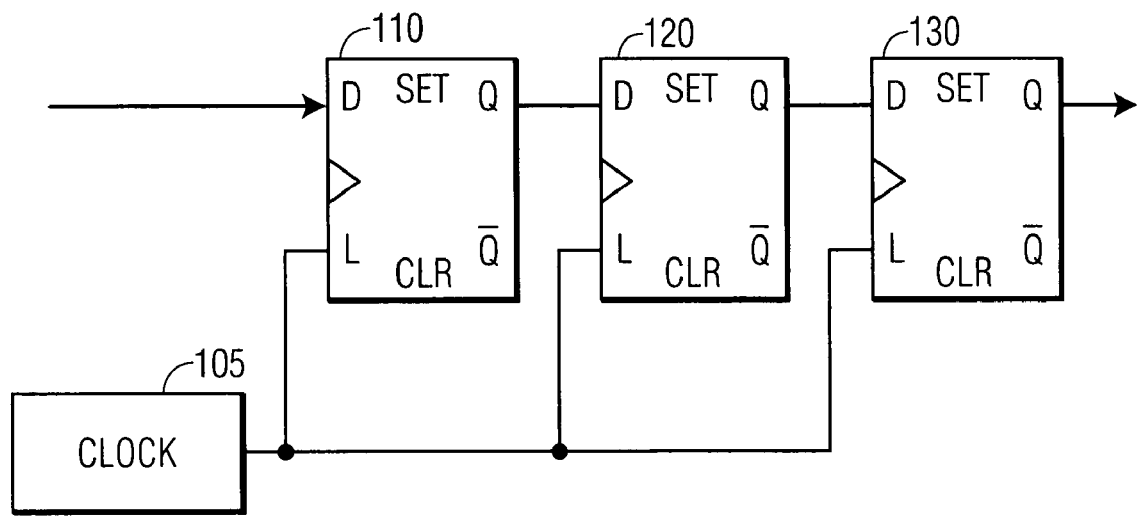
FIG. 2 illustrates a prior art cascaded of D-type flip-flops to detect metastability.

FIG. 2 shows a conventional cascading of several flip-flops 210, 220, 230. We know that the probability of the circuit to have a stable output resulting in a 0 or 1 even at metastable input is quite high. If the input to the circuit comes from a metastable flip-flop, the output signal is random, most of the time at the standard logic levels.

However, if the input to the circuit does not come from the output of a metastable flip-flop, the output is deterministic in that it is directly derived from the clock 205 and the input applied at the gate D of flip-flop 110.

Rather than force a single flip-flop into a metastable state, It is proposed by the inventor to use a large number (e.g., several thousand) of slightly different flip-flops. One or a few of them become metastable, producing random output. By XOR-ing all of their outputs, which is equivalent to calculating the parity of all the outputs, the invention provides a random signal without knowing which of the particular flip-flops are behaving randomly and which are acting deterministically.

There are many different ways to implement the instant invention, and it should be understood that the following examples are shown for purposes of illustration and not for limitation.

Figure 3A:
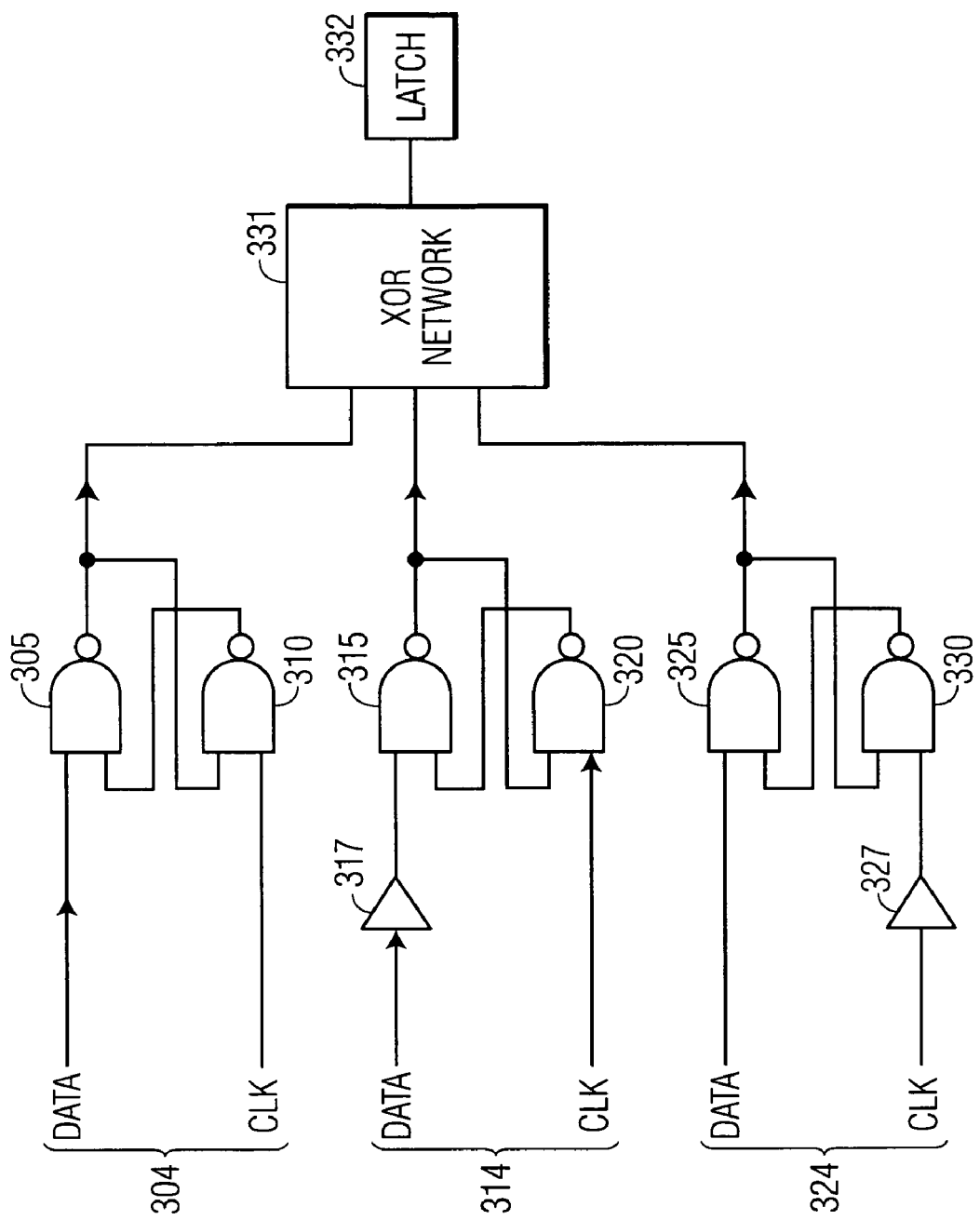
FIG. 3A shows a first way that a variable delay can be introduced into the circuit arrangement by including a buffer at some of the data or clock inputs of the circuit.
Figure 3B:
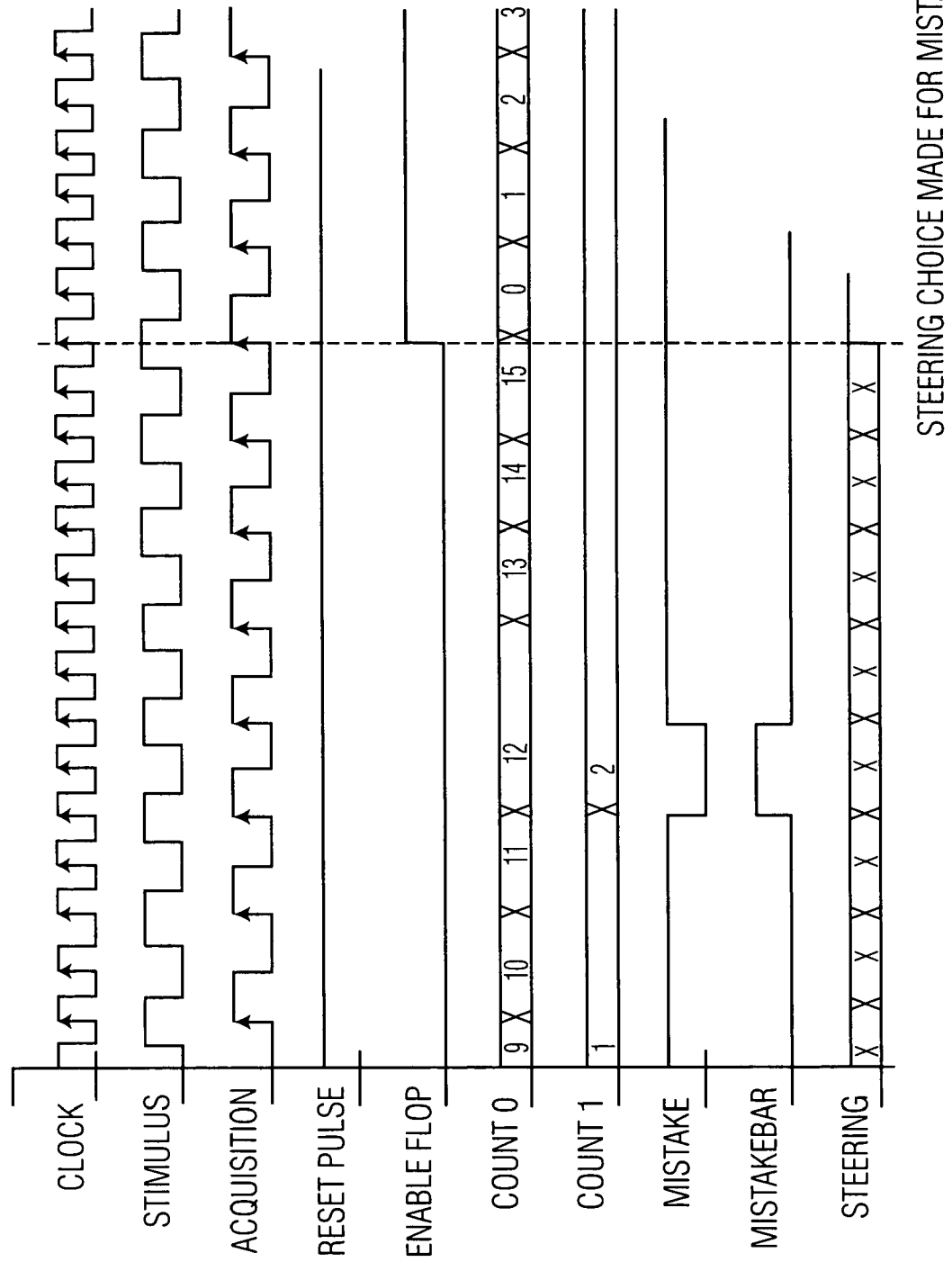
FIG. 3B shows a second way that a variable delay can be introduced into the circuit arrangement by including a buffer at some of the cross-connected outputs.
Figure 3C:
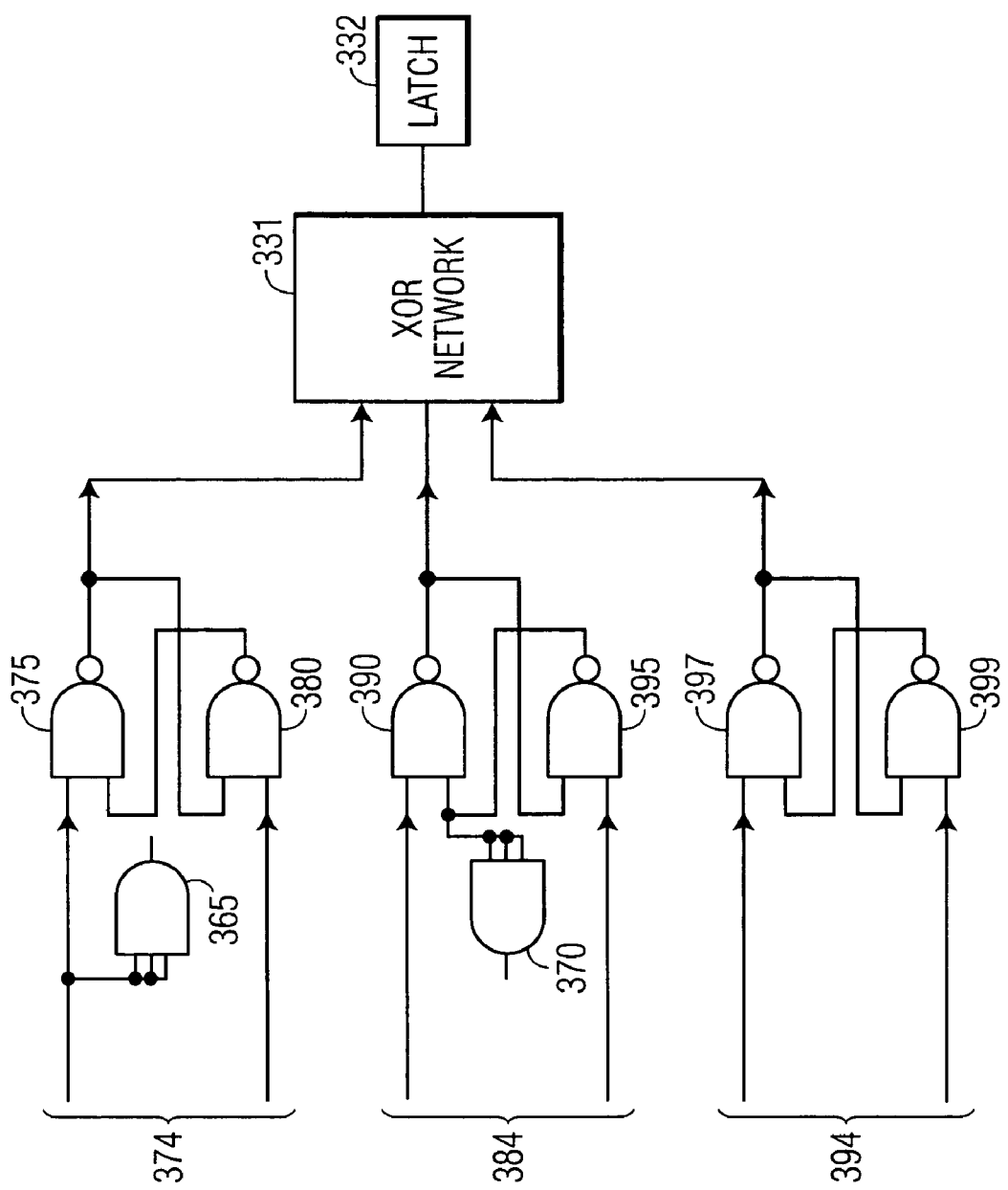
FIG. 3C shows a third way that a variable delay can be introduced into the circuit arrangement by capacitive loading of some of the gates.

With regard to FIGS. 3A-3C, three techniques are shown to partition the flip-flops into groups (304, 314, 324; 334, 344, 354; 374, 384, 394). In each group the DATA and CLK inputs are connected to the same signal source, preferably a digital square wave generator.

As shown in FIG. 3A, the first group 304 comprises a plurality of flip-flops formed by NAND gates 305 and 310 without any buffers inserted between the data and clock signals. However, the second group 314 comprises of a plurality of flip-flops formed by NAND gates 315, 320, and have buffers 317 inserted between the data line and one of the flip-flops (in this case 320). The third group 324 comprises a plurality of flip-flops formed by NAND Gates 325, 330 having their clock input connected through buffers 327. This way the layout dependent delay values for the flip-flops cause offsets varying around 0, + gate delay or − one gate delay.

The outputs of the three groups are connected to an exclusive OR gate network 331, that effectively calculates the parity of all the outputs. The output of the XOR gate network is input to a latch 332. For example, the first 2 flip-flop outputs get XOR-ed, their output and the third flip-flop out put XOR-ed with a second XOR gate, and so on, until the last flip-flop output is XOR-ed with the output of the previous XOR gate. Since XOR is addition modulo 2, XOR-ing many digital signals is the same as calculating their sum modulo 2, which is the parity of their sum.

As shown in FIG. 3B, the flip-flops here are realized by two groups of NAND gates. The first group comprises a plurality of flip-flops realized by NAND gates 335 and 340 have a delay buffer 342 in one of the cross connection lines, while another group of flip-flops are realized by NAND gates 345, 350, having delay buffers 347 in the other cross-connection line, while the third group of flip-flops comprises a plurality of NAND gates 355, 360 have no delay buffers.

Again, the outputs of the three groups are connected to an exclusive OR gate network 331, effectively calculating the parity of all the outputs.

Finally, FIG. 3C shows yet another way to arrange the flip-flops, in this case having a capacitive load 365, 370 added to one of the data or clock inputs of one of the NAND gates 375, 390 in the form of a multi-input gate. A third set of gates 397, 399 would have no capacitive load at all attached thereto. The capacitance of the parallel connected inputs of multi-input gates slows down the signal changes, effectively introducing some delays. The output of these "load" gates 365, 370 need not be connected anywhere and may float. In the instance of the flip-flops formed by instances of NAND gate 390, the cross connected output of gate 395 is connected to the inputs of multi-input gate 370. The coupling of the multi-input gate affects the circuit timing.

There are a number of variations possible according to the circuit point the capacitive load is attached to: the input of the upper (375, 390) or lower (380, 395) NAND gates.

Similar to the other arrangements, the outputs of the pairs of gates are connected to an exclusive OR gate network 331 that effectively calculates the parity of all the outputs.

It should be understood that there could be literally thousands of flip-flops being partitioned into groups as shown in FIG. 3A, 3B or 3C. It is also possible to use a different number of flip-flops for each group, and implement only some of the possible groups in one instance of the invention. It is even possible to intermingle combinations of all three types of arrangements shown in respective FIGS. 3A through 3C. Finally, while NAND gates are shown, a person of ordinary skill in the art knows that equivalent Boolean configurations could be used. In fact, an equivalent arrangement of one of the pairs of NAND gates shown above, that is cross connected with another NAND gate, there could also be another way to introduce delay without the need for explicitly designing the circuit to have different delay values.

What is claimed is:

1. A random number generator comprising:
   a plurality of groups of independent flip-flops, at least some of the groups having different connection configurations, wherein the groups comprise NAND gates connected in different configurations,
   an exclusive-or (XOR) network connected to all of the outputs of the plurality of groups of flip-flops, wherein a metastable output of at least one flip-flop of the plurality of groups of flip-flops causes a random signal to be output by the XOR network for number generation, and
   a latch connected to the output of the XOR network.

2. The random number generator according to claim 1, wherein the groups of flip-flops are divided into at least three equally-sized groups.

3. The random number generator according to claim 1, wherein a first group of flip-flops comprises a first pair of cross-connected NAND gates without any buffers connected to first data and clock input lines,
   wherein a second group of flip-flops comprises a second pair of cross-connected NAND gates with a first buffer connected to a second data input line of at least one NAND gate of the second pair of NAND gates; and
   wherein a third group of flip-flops comprises a third pair of cross-connected NAND gates with a second buffer connected to a second clock input line of at least one NAND gate of the third pair of NAND gates.

4. The random number generator according to claim 1, wherein a first group of flip-flops comprises a first pair of cross-connected NAND gates without any buffers connected within a cross connection between the first pair of NAND gates, and
   wherein a second group of flip-flops comprises a second pair of cross-connected NAND gates with a delay buffer connected within a cross connection between the NAND gates of the second pair of the NAND gates.

5. The random number generator according to claim 1, wherein a first group of flip-flops comprises a first pair of cross-connected NAND gates without any load connected to either of the NAND gates,
   wherein a second group of flip-flops comprises a second pair of cross-connected NAND gates with a first capacitive load connected to a data input line of at least one NAND gate of the second pair of NAND gates, and
   wherein a third group of flip-flops comprises a third pair of cross-connected NAND gates with a second capacitive load connected to a clock input of at least one NAND gate of the third pair of NAND gates.

6. The random number generator according to claim 5, wherein at least one capacitive load of the first and second capacitive loads comprises a multi-input gate.

7. The random number generator according to claim 1, wherein the groups of flip-flops comprise unequal numbers of flip-flops in each group.

8. The random number generator according to claim 1, wherein delay devices connected within each of the groups of flip-flops have different delay values.

9. The random number generator according to claim 1, wherein at least some of the flip-flops comprise NAND gates implemented with Boolean equivalents of NAND gates.

10. The random number generator according to claim 1, wherein the groups of flip-flops are arranged into one of thirds or fifths.

11. A method for random number generation, comprising
providing a plurality of groups of independent flip-flops, at least some of the groups having different connection configurations, wherein the groups comprise NAND gates connected in different configurations,
connecting each of the outputs of the plurality of groups of flip-flops to an exclusive-or (XOR) network, wherein a metastable output of at least one of flip-flops causes a random signal to be output by the XOR network, and
connecting a latch to the output of the XOR network to receive the random signal output by the XOR network for random number generation.

12. The method according to claim 11, wherein providing the plurality of independent flip-flops further comprises:
arranging the groups of flip-flops into three equally-sized groups.

13. The method according to claim 11, wherein a first group comprises a first pair of cross-connected NAND gates without any buffers connected to first data and clock input lines,
wherein a second group comprises a second pair of cross-connected NAND gates with a first buffer connected to a second data input line of at least one NAND gate of the second pair of NAND gates; and
wherein a third group comprises a third pair of cross-connected NAND gates with a second buffer connected to a second clock input line of at least one NAND gate of the third pair of NAND gates.

14. The method according to claim 11, wherein a first group comprises a first pair of cross-connected NAND gates without any buffers connected within a cross connection between the first pair of NAND gates, and
wherein a second group comprises a second pair of cross-connected NAND gates with a delay buffer connected within a cross connection between the NAND gates of the second pair of NAND gates.

15. The method according to claim 11, wherein a first group comprises a first pair of cross-connected NAND gates without any load connected to either of the NAND gates,
wherein a second group comprises a second pair of cross-connected NAND gates with a first capacitive load connected to a data input line of at least one NAND gate of the second pair of NAND gates, and
wherein a third group comprises a third pair of cross-connected NAND gates with a second capacitive load connected to a clock input line of at least one NAND gate of the third pair of NAND gates.

16. The method according to claim 15, wherein at least one capacitive load of the first and second capacitive loads comprises a multi-input gate.

17. The method according to claim 11, wherein providing the plurality of groups of independent flip-flops further comprises arranging the groups of flip-flops to define groups with unequal numbers of flip-flops in each group.

18. The method according to claim 11, wherein each of the groups of flip-flops have different delay values.

19. The method according to claim 11, wherein providing the plurality of groups of independent flip-flops comprises providing NAND gates and Boolean equivalents of NAND gates.

20. The method according to claim 11, wherein the groups of flip-flops are arranged into one of thirds or fifths.

* * * * *